US011538659B2

(12) United States Patent
Nakamura et al.

(10) Patent No.: US 11,538,659 B2
(45) Date of Patent: Dec. 27, 2022

(54) CHARGED PARTICLE BEAM DEVICE, AUTOFOCUS PROCESSING METHOD OF CHARGED PARTICLE BEAM DEVICE, AND DETECTOR

(71) Applicant: Hitachi High-Tech Corporation, Tokyo (JP)

(72) Inventors: Mitsuhiro Nakamura, Tokyo (JP); Michio Hatano, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 0 days.

(21) Appl. No.: 17/280,661

(22) PCT Filed: Oct. 25, 2018

(86) PCT No.: PCT/JP2018/039624
§ 371 (c)(1),
(2) Date: Mar. 26, 2021

(87) PCT Pub. No.: WO2020/084729
PCT Pub. Date: Apr. 30, 2020

(65) Prior Publication Data
US 2022/0044906 A1    Feb. 10, 2022

(51) Int. Cl.
*H01J 37/21* (2006.01)
*H01J 37/20* (2006.01)
(Continued)

(52) U.S. Cl.
CPC .............. *H01J 37/21* (2013.01); *H01J 37/20* (2013.01); *H01J 37/244* (2013.01); *H01J 37/265* (2013.01)

(58) Field of Classification Search
CPC .. H01J 37/00; H01J 37/02; H01J 37/20; H01J 37/21; H01J 37/26; H01J 37/265; H01J 37/18; H01J 37/22; H01J 37/28
(Continued)

(56) References Cited

U.S. PATENT DOCUMENTS

2004/0046120 A1\* 3/2004 Moses ..................... H01J 37/20
250/311
2008/0152461 A1\* 6/2008 Dente ................. F16B 25/0084
411/413
(Continued)

FOREIGN PATENT DOCUMENTS

JP    2012-221766 A    11/2012
JP    2013-134952 A    7/2013
(Continued)

OTHER PUBLICATIONS

International Search Report (PCT/ISA/210) issued in PCT Application No. PCT/JP2018/039624 dated Jan. 15, 2019 with English translation (six (6) pages).
(Continued)

*Primary Examiner* — Jason L McCormack
(74) *Attorney, Agent, or Firm* — Crowell & Moring LLP

(57) ABSTRACT

Provided are a charged particle beam device and a detector capable of non-invasively observing a biochemical sample without a staining treatment or an immobilization treatment, with a simple and high observation throughput. An electron optics system, a stage 64, a sample chamber 100 holding a sample and including a first insulating layer 110 that is in contact with the sample, and a conductive layer 120 that is formed on the first insulating layer, signal detection circuits 20 and 50 connected to the conductive layer and detecting a current flowing through the conductive layer, and a main control unit 14 for controlling the electron optics system and the stage, wherein the main control unit 14 irradiates the
(Continued)

conductive layer of the sample chamber placed on the stage with an electron beam from the electron optics system and is input with a detection signal from the signal detection circuit.

29 Claims, 10 Drawing Sheets

(51) Int. Cl.
  *H01J 37/244* (2006.01)
  *H01J 37/26* (2006.01)
(58) Field of Classification Search
  USPC .......................................... 250/306, 307, 311
  See application file for complete search history.

(56) References Cited

U.S. PATENT DOCUMENTS

| | | | |
|---|---|---|---|
| 2009/0152461 A1* | 6/2009 | Kim | ........................ H01L 22/14 250/307 |
| 2014/0021347 A1 | 1/2014 | Ominami et al. | |
| 2014/0346352 A1* | 11/2014 | Ogura | ...................... H01J 37/28 250/307 |
| 2015/0214003 A1 | 7/2015 | Ogura | |
| 2016/0056012 A1 | 2/2016 | Ogura | |

FOREIGN PATENT DOCUMENTS

| | | |
|---|---|---|
| JP | 2014-22323 A | 2/2014 |
| JP | 2014-203733 A | 10/2014 |
| JP | 2016-72184 A | 5/2016 |
| WO | WO 2017/183168 A1 | 10/2017 |

OTHER PUBLICATIONS

Japanese-language Written Opinion (PCT/ISA/237) issued in PCT Application No. PCT/JP2018/039624 dated Jan. 15, 2019 (three (3) pages).

\* cited by examiner

[FIG. 1]
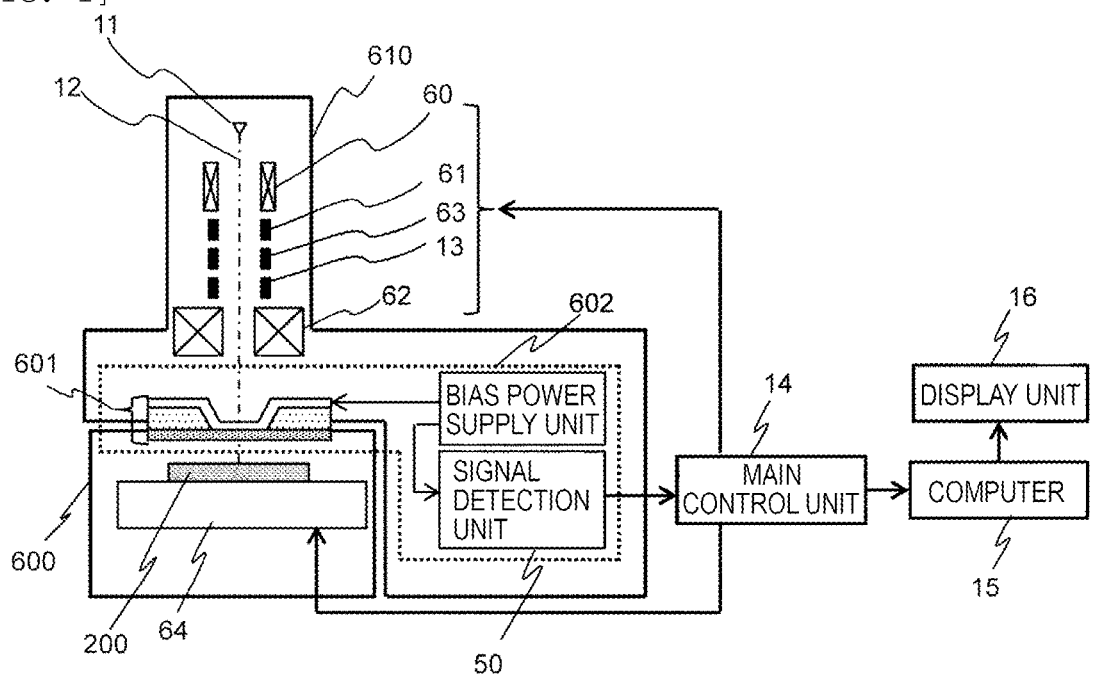
[FIG. 2]
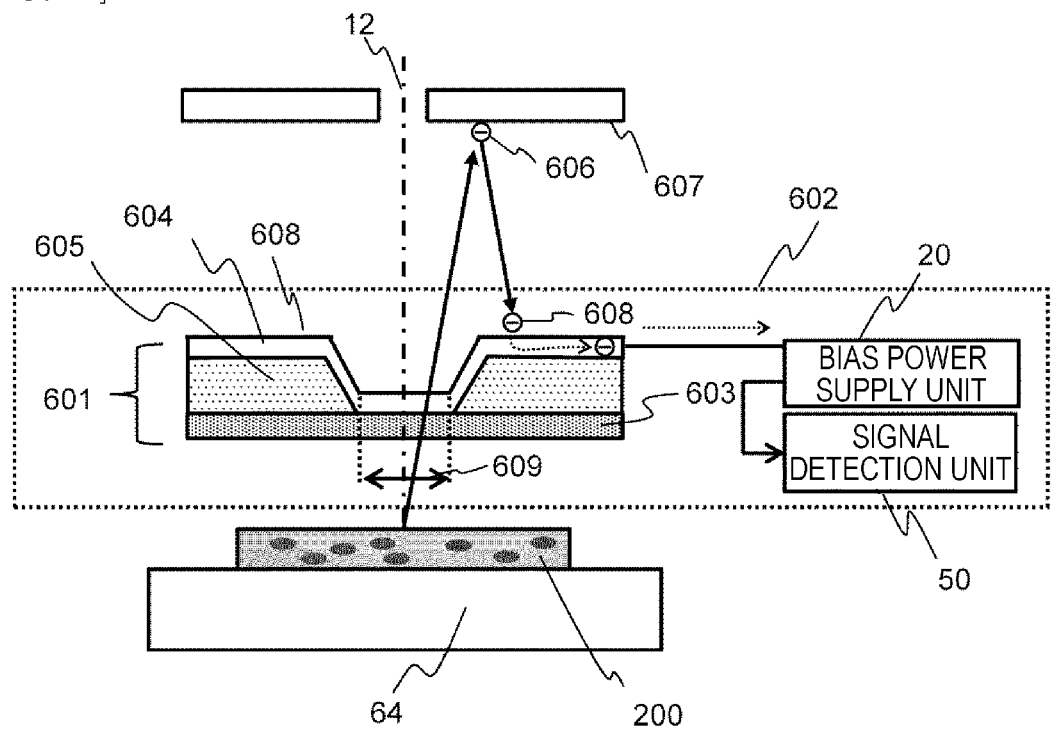

[FIG. 3]
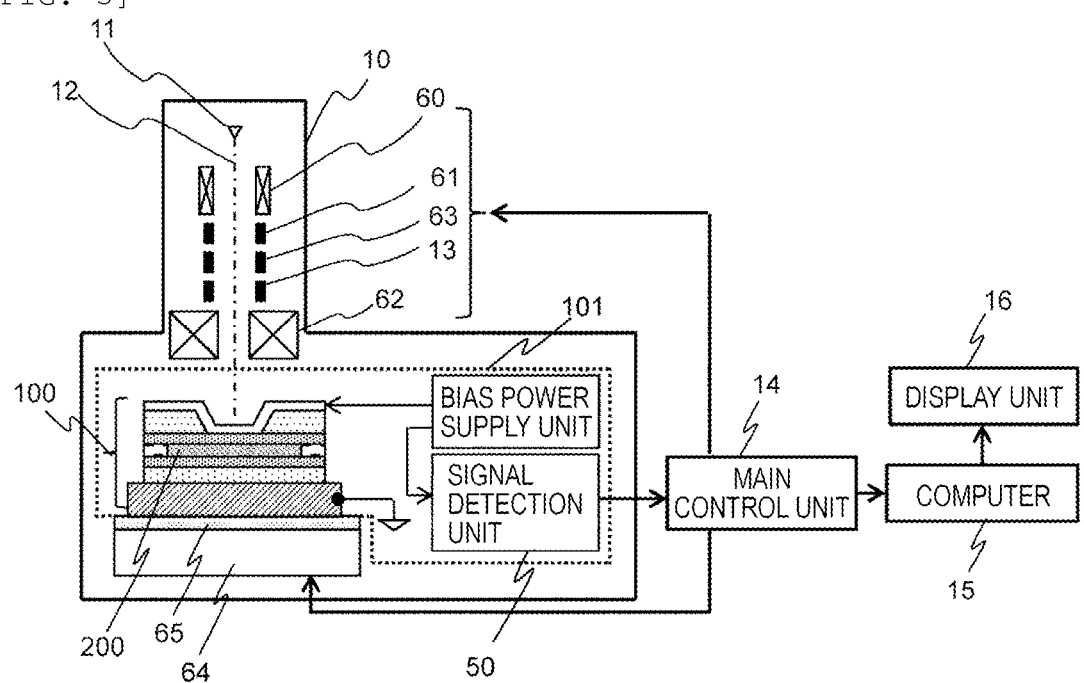
[FIG. 4A]
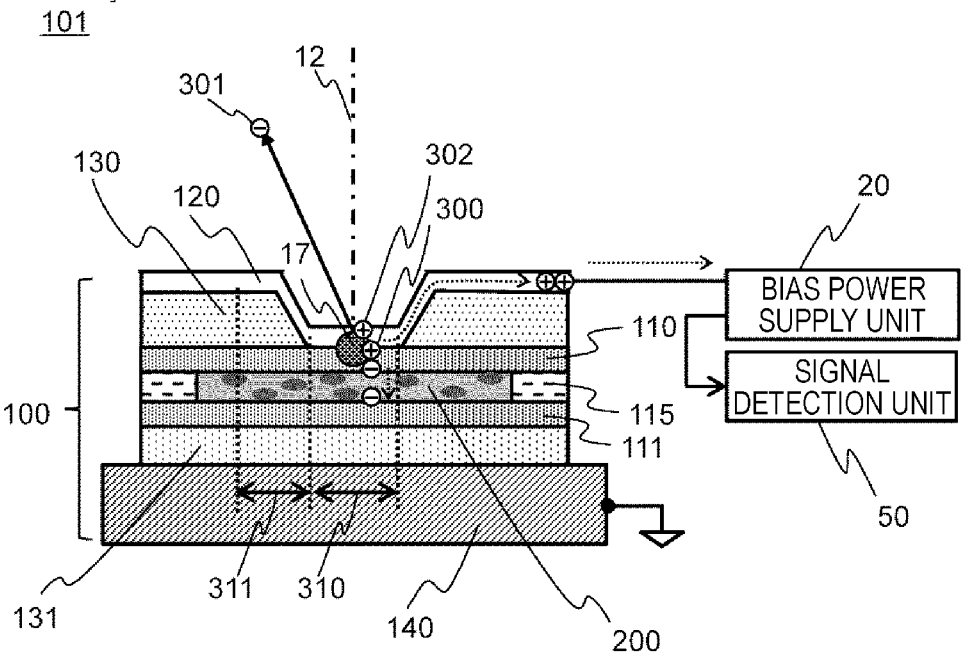

[FIG. 4B]
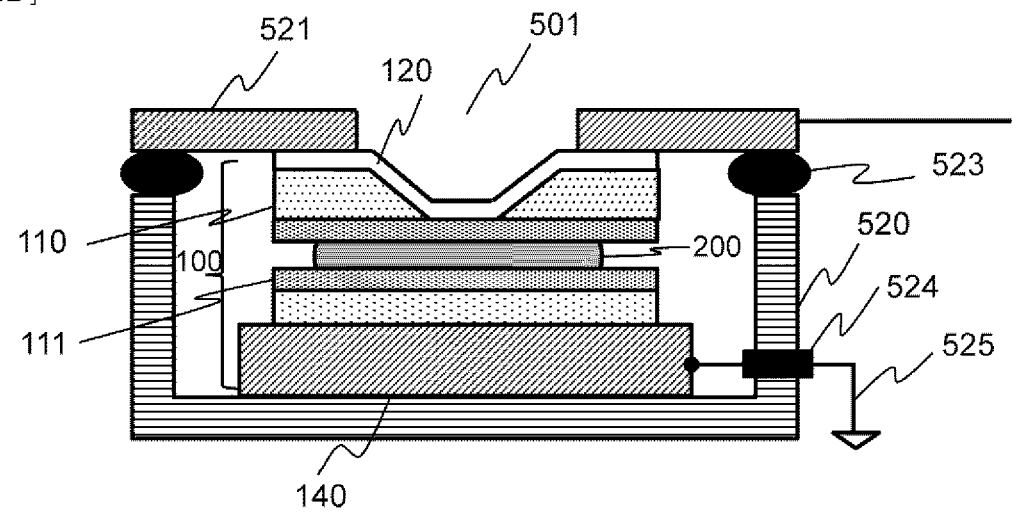
[FIG. 5]
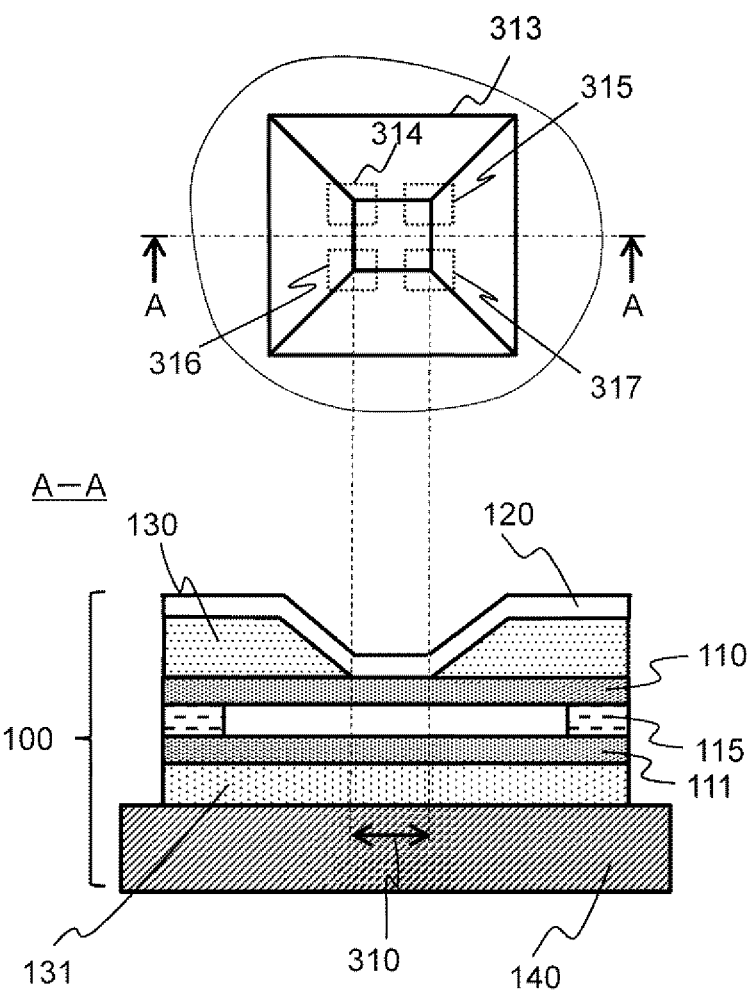

[FIG. 6A]
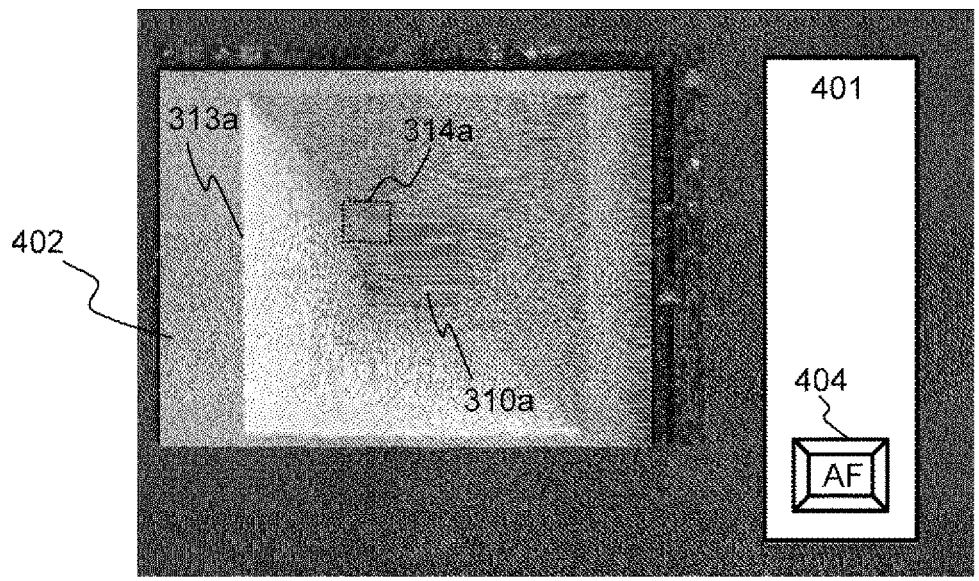
[FIG. 6B]
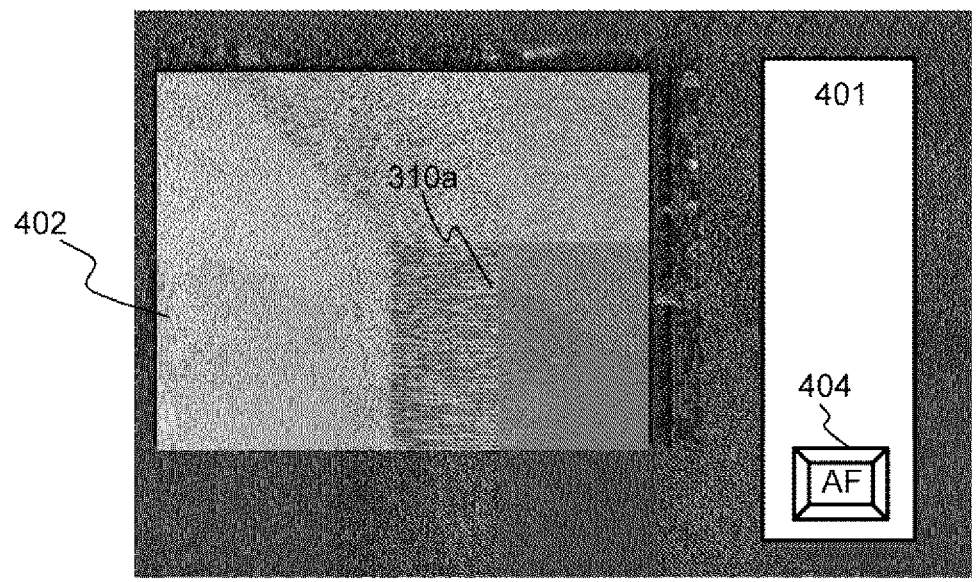

[FIG. 7]
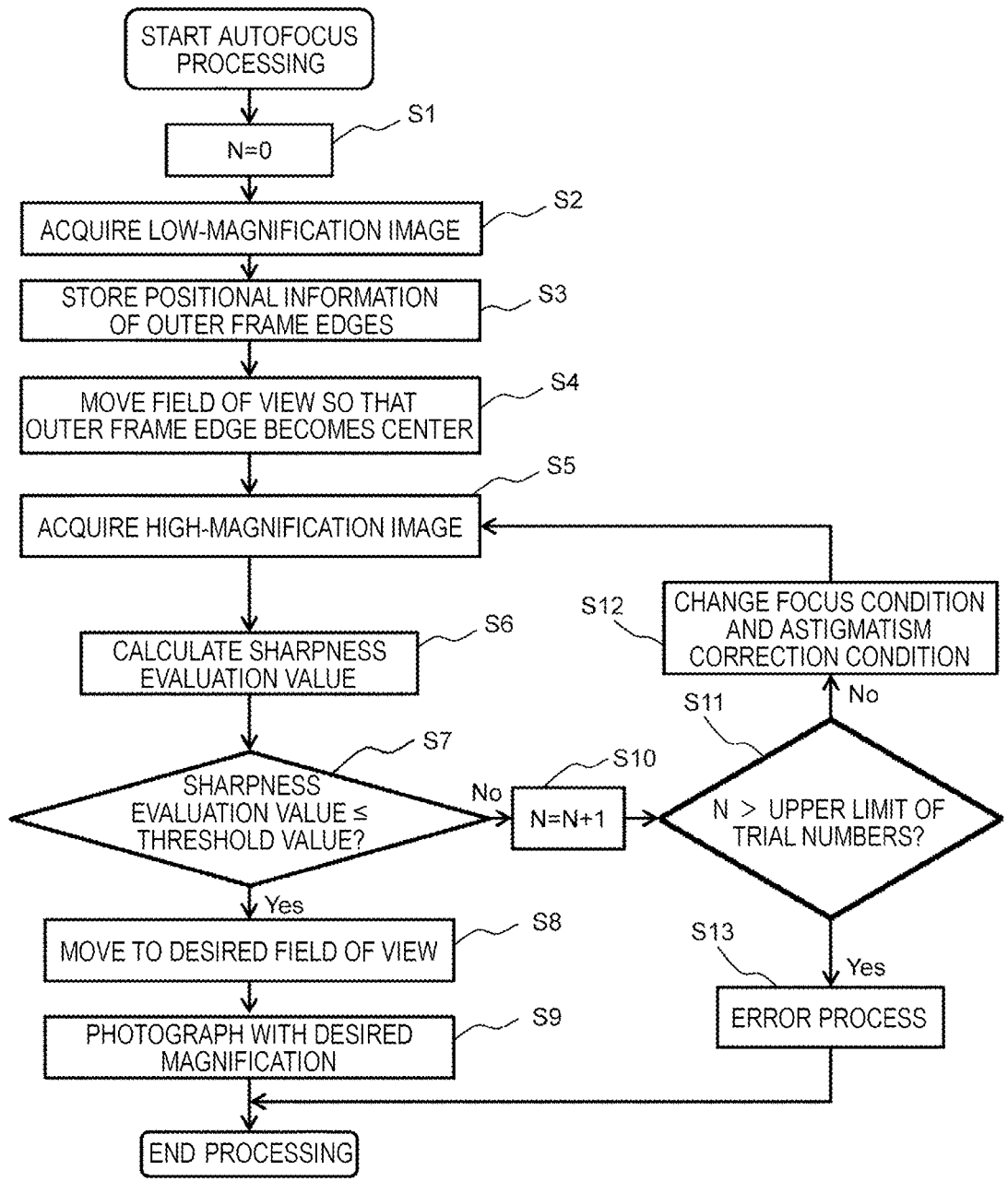

[FIG. 8]
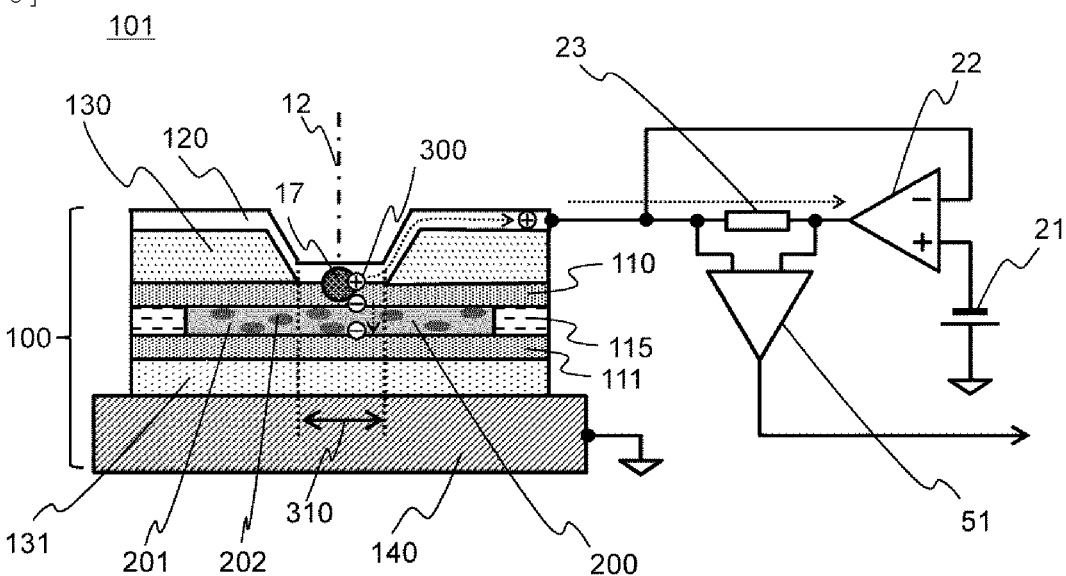
[FIG. 9]
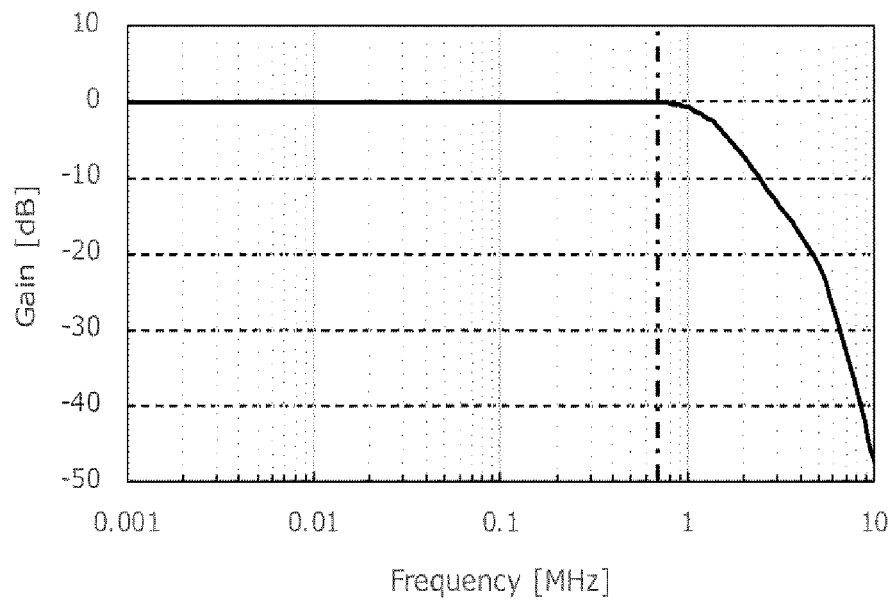

[FIG. 10]
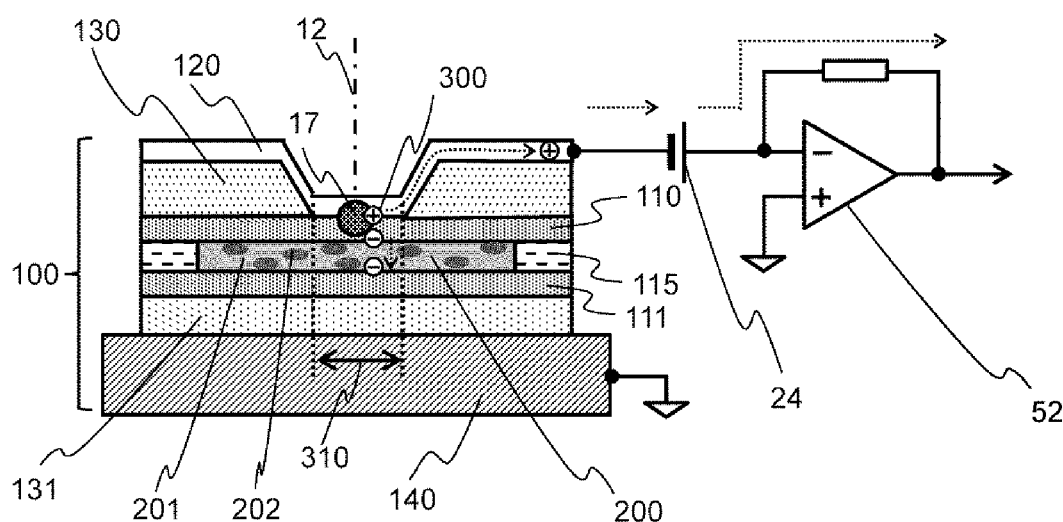
[FIG. 11]
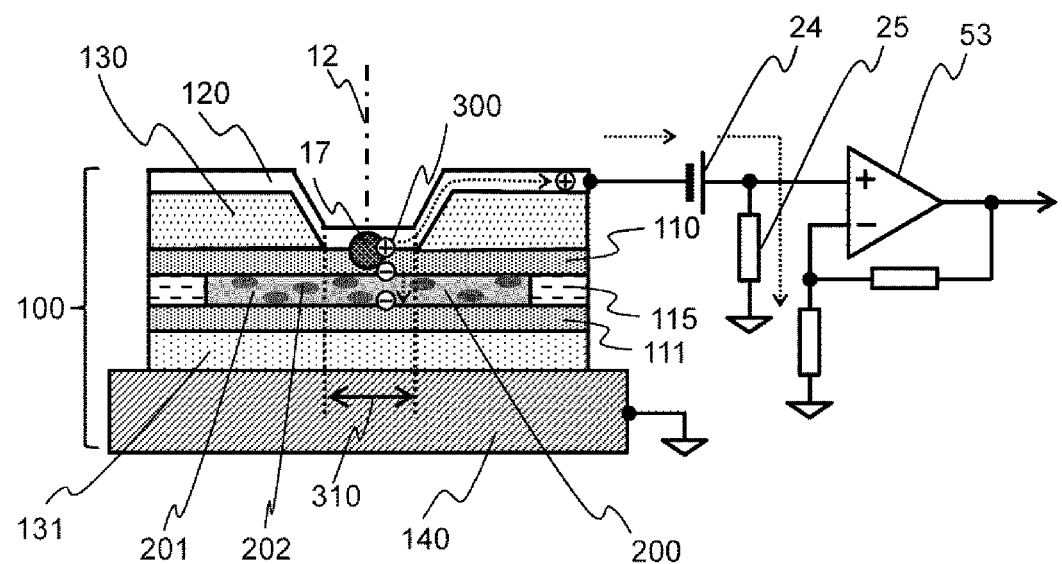

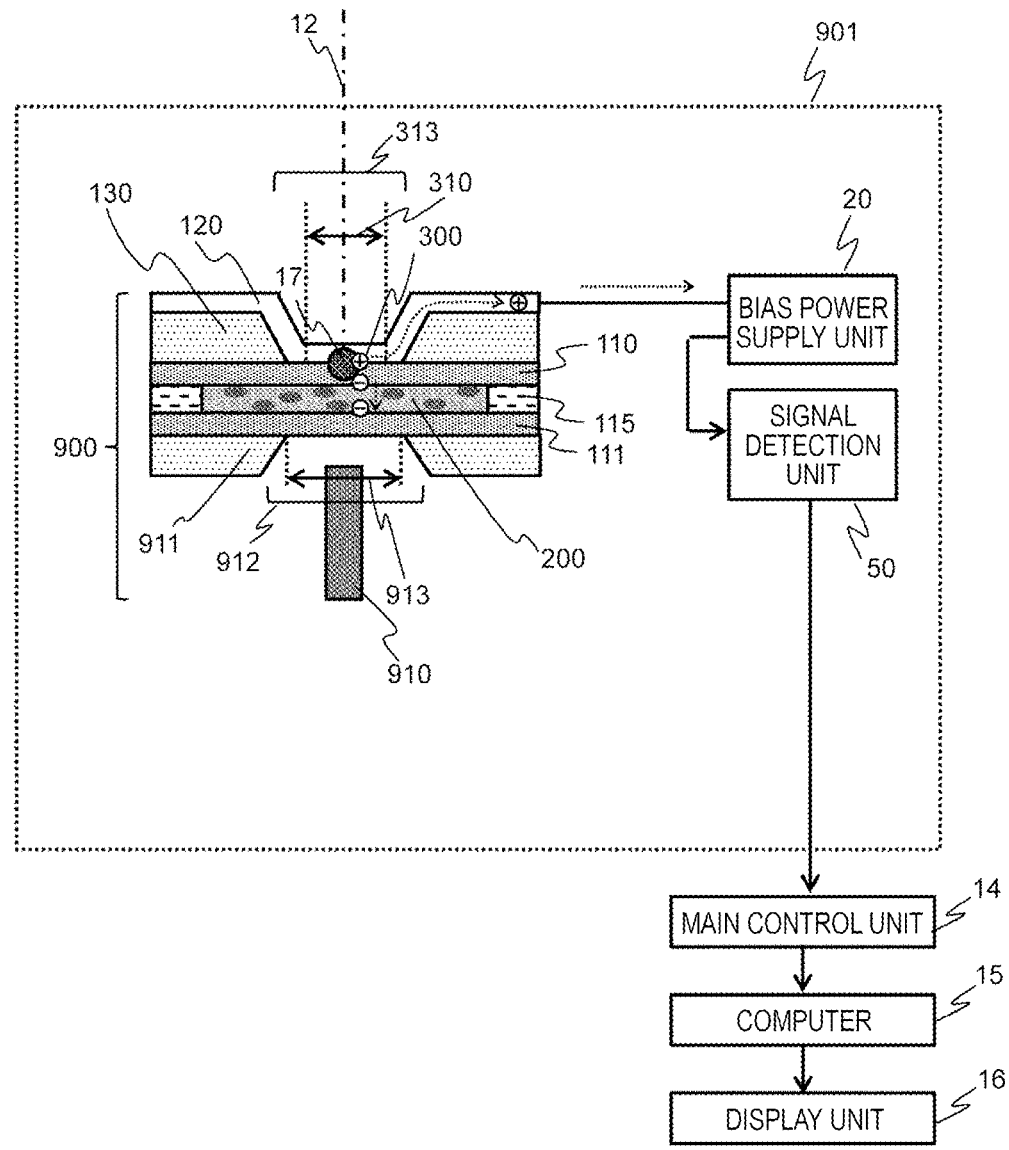
[FIG. 12]

[FIG. 13]
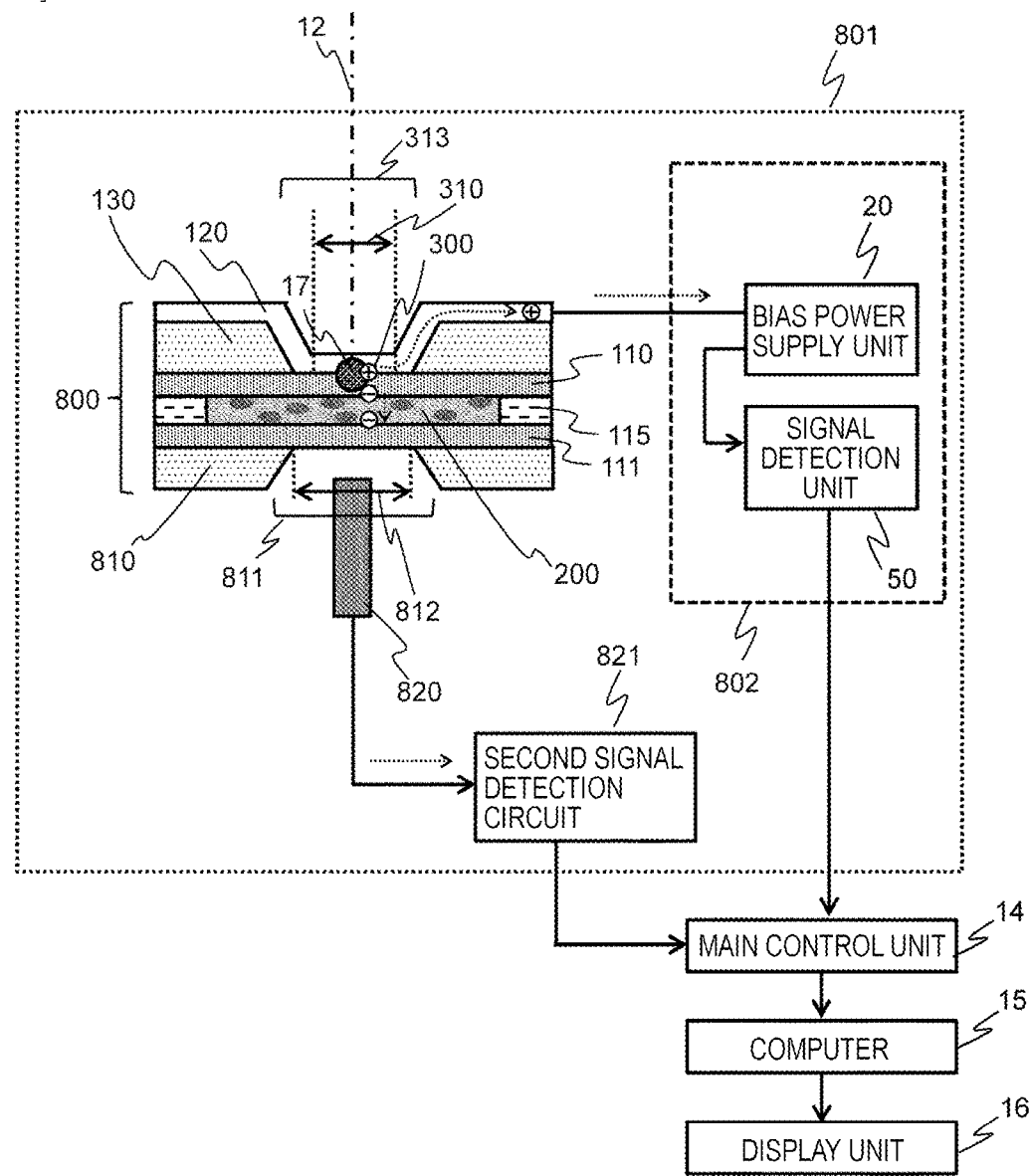

[FIG. 14]
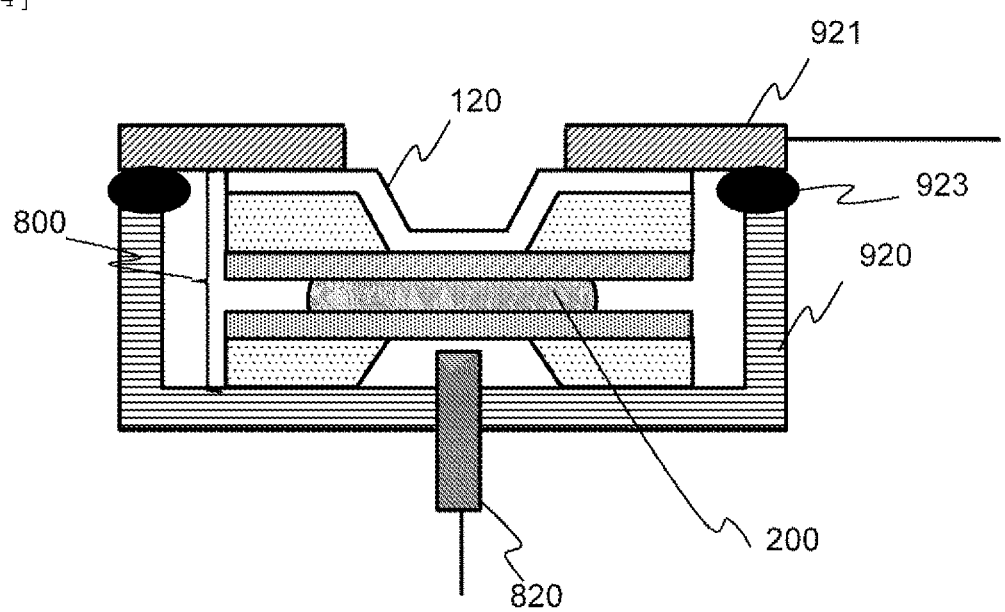

CHARGED PARTICLE BEAM DEVICE, AUTOFOCUS PROCESSING METHOD OF CHARGED PARTICLE BEAM DEVICE, AND DETECTOR

TECHNICAL FIELD

The present invention relates to a charged particle beam device and a detector for observing the shape or material of a sample by using a detection signal generated by being irradiated with a charged particle beam. More specifically, the present invention relates to a charged particle beam device and a detector capable of observing a biochemical sample or a liquid sample in a non-invasive state while suppressing the change in the state or damage.

BACKGROUND ART

The scanning electron microscope (SEM), which is one of the charged particle beam devices, is widely used as a tool for observing not only material samples such as metals and ceramics but also biological samples with high resolution.

Generally, in such a device, the housing is evacuated, the sample is placed in a vacuum atmosphere and imaged. Since the electron beam is scattered by gas molecules and liquid molecules such as the atmosphere, the passage path of the electron beam is preferably kept in a vacuum atmosphere. On the other hand, when placed in a vacuum atmosphere, biochemical samples and liquid samples are damaged or their states change, and thus, it has been considered difficult to observe in a non-invasive state. However, there is a great need for non-invasive observation of such samples, and in recent years, electron microscopes capable of observing the sample to be observed in an atmospheric pressure environment or in a liquid environment have been developed.

PTL 1 describes an SEM capable of observing a sample while the sample is kept in an atmospheric pressure atmosphere. In this device, a membrane through which an electron beam can pass is provided between the electron optics system and the sample to separate the vacuum state from the atmospheric state. An SEM image is obtained by arranging a sample near the atmosphere side of the membrane, irradiating the sample directly with an electron beam in a state where the sample and the membrane are basically not in contact with each other, and detecting signal electrons generated from the sample. In this device, the membrane that acts as a vacuum partition keeps the path until just before the electron beam reaches the membrane in a high vacuum state to prevent scattering of the electron beam, and the region after the penetration of the membrane where the scattering of the electron beam occurs is limited to a very short distance between the sample and the membrane, thereby enabling the observation.

Further, PTLs 2 and 3 disclose a sample holder and an observation system for observing a biological sample in an aqueous solution in a living state using a scanning electron microscope without performing a staining treatment or an immobilization treatment. When observing a biological sample with a scanning electron microscope, the interaction between the electron beam and the biological sample is extremely low, so various staining treatments and immobilization treatments have been commonly performed in order to improve the contrast of the observation image. When such treatment is performed, the biological sample to be observed is killed, and it becomes impossible to observe the sample in a living state. In addition, when a high-energy electron beam is directly applied to the sample, the damage may destroy the biological sample.

The observation system disclosed in PTLs 2 and 3 uses a submerged sample holder that includes a first insulating film whose one main surface is a holding surface for an observation sample, and a conductive film laminated on the other main surface of the first insulating film, and the conductive film is irradiated with an electron beam from the conductive film side with a ground potential or a predetermined bias voltage applied. Due to the irradiated electron beam, a local potential change occurs on one main surface of the first insulating film. A signal based on this potential change is detected by a detection electrode provided below a second insulating film arranged on the opposite side across the observation sample. The signal based on the potential change generated in the first insulating film propagates through the observation sample and is detected by the detection electrode. The signal propagation force at this time differs depending on the observation sample. For example, since water has a high relative permittivity of about 80, signals can be propagated well, while biological samples have a low relative permittivity of about 2 to 3, and the signal propagating force is reduced. Therefore, based on the difference in intensity of the potential change signal propagated through the observation sample, the biological sample in the aqueous solution can be observed with high contrast without staining treatment. This technique is suitable for damage-less observation of submerged biological samples because it is not necessary to directly apply a high-energy electron beam to the sample to be observed.

CITATION LIST

Patent Literature

PTL 1: JP-A-2012-221766
PTL 2: JP-A-2014-203733
PTL 3: JP-A-2016-072184

SUMMARY OF INVENTION

Technical Problem

In the device of PTL 1, a detector is required as a component for detecting signal electrons. Therefore, it may lead to an increase in cost.

In the observation systems of PTLs 2 and 3, a detection electrode provided below the sample holder is used for detecting the potential change signal. From the principle of observation, the sample holder may have a laminated film of a first insulating film and a conductive film on the side irradiated with an electron beam, and a second insulating film on the opposite surface across the observation sample. However, in order to be used as a sample holder, it is necessary that a layer serving as a frame for maintaining the strength of the sample holder is provided, and the layer serving as the frame is partially processed to form a desired laminated film or to expose the second insulating film. In particular, since the detection electrode provided below the sample holder is used for detecting the potential change signal, it is necessary to process both the upper surface and the lower surface of the sample holder, which may lead to an increase in cost.

The present invention has been made in view of such problems and an object thereof is to provide a charged particle beam device and a detector capable of observing a biochemical sample or a liquid sample without a staining treatment or an immobilization treatment in a non-invasive state while suppressing the change in the state or damage, with a simple and high observation throughput.

Solution to Problem

The charged particle beam device according to an embodiment of the present invention includes an electron optics system, a stage, a sample chamber holding the sample and including a first insulating layer that is in contact with the sample and a conductive layer formed on the first insulating layer, a signal detection circuit connected to the conductive layer and detecting a current flowing through the conductive layer, and a main control unit for controlling the electron optics system and the stage, in which the main control unit irradiates the conductive layer of the sample chamber placed on the stage with an electron beam from the electron optics system, and is input with a detection signal from the signal detection circuit.

Advantageous Effects of Invention

The charged particle beam device makes it possible to observe a biochemical sample and a liquid sample in a non-invasive state while suppressing the change in the state and damage without a staining treatment or an immobilization treatment.

Other challenges and novel features will become apparent from the description and accompanying drawings of the present specification.

BRIEF DESCRIPTION OF DRAWINGS

FIG. 1 is a configuration diagram of a scanning electron microscope.
FIG. 2 is a configuration diagram of a detector.
FIG. 3 is a configuration diagram of a scanning electron microscope.
FIG. 4A is a configuration diagram of a detector.
FIG. 4B is another configuration example of a sample chamber.
FIG. 5 is a diagram showing the shape of the sample chamber.
FIG. 6A is a diagram showing a display unit screen.
FIG. 6B is a diagram showing a display unit screen.
FIG. 7 is a flowchart of an autofocus function.
FIG. 8 is a diagram illustrating another configuration example of the detector.
FIG. 9 is a circuit simulation result of the response frequency characteristic of a signal detection circuit.
FIG. 10 is a diagram illustrating another configuration example of the detector.
FIG. 11 is a diagram illustrating another configuration example of the detector.
FIG. 12 is a diagram illustrating another configuration example of the detector.
FIG. 13 is a diagram illustrating another configuration example of the detector.
FIG. 14 is another configuration example of the sample chamber.

DESCRIPTION OF EMBODIMENTS

Hereinafter, embodiments of the present invention will be described with reference to the drawings.

Example 1

FIG. 1 shows a configuration diagram of the scanning electron microscope according to Example 1. A column 610 is built-in with an electron optics system that irradiates a sample to be observed with an electron beam. The electron optics system is arranged on the column 610 and includes an electron gun 11, and a condenser lens 60 and an objective lens 62 that focus an electron beam 12 emitted from the electron gun 11 to irradiate a sample 200 as a minute spot, an astigmatism corrector 61 that corrects astigmatism of the electron beam 12, a deflector 13 that scans the electron beam 12 two-dimensionally on the sample 200, and an image shifter 63 that shifts the scanning center position of the electron beam 12 two-dimensionally on the sample 200. The column 610 is kept in a high vacuum environment.

Further, a sample chamber 600 for storing the sample 200 is provided, and the sample chamber 600 is provided with a stage 64 that can be moved three-dimensionally. The sample chamber 600 is maintained in an atmosphere with a vacuum degree lower than the vacuum degree of the column 610, for example, such as an atmosphere of atmospheric pressure. The sample 200 is held on the stage 64 in the sample chamber 600.

The column 610 and the sample chamber 600 are connected via a vacuum membrane holder 601, and the vacuum membrane holder 601 is connected to a signal detection circuit to form a detector 602.

The electron optics system and the stage 64 are controlled by the main control unit 14, and a detection signal (voltage signal) from the detector 602 is input to the main control unit 14.

The configuration of the detector 602 will be described later, but the voltage signal output from a signal detection unit 50 of the detector 602 for each irradiation position of the electron beam 12 to the sample 200 is converted into pixel gradation data according to the intensity thereof and is output to a computer 15 as image data every time one frame scan is completed, one line scan is completed, or one pixel scan is completed, depending on the deflection speed. The image data is displayed on a display unit 16 by the computer 15.

The configuration of the detector 602 will be described with reference to the configuration diagram of the detector 602 shown in FIG. 2. The vacuum membrane holder 601 (the cross-sectional view is shown in the figure) is a laminated body of several mm to a dozen mm square. The vacuum membrane holder 601 is provided with a membrane that isolates a low vacuum or atmospheric pressure atmosphere in which the sample 200 is arranged from the vacuum inside the column on the irradiation surface side of the electron beam 12. The membrane includes at least two layers of an insulating layer 603 on the sample 200 side and a conductive layer 604 on the side where the electron beam 12 is incident. The insulating layer 603 is supported by an outer frame portion 605 provided for the purpose of maintaining strength, and the conductive layer 604 is uniformly formed on the outer frame portion 605 and the insulating layer 603. The sample 200 is placed on the stage 64 in the sample chamber 600.

The material of each layer is illustrated. A silicon nitride (SiN) film can be used for the insulating layer 603, a metal thin film such as tungsten or tantalum can be used for the conductive layer 604, and a silicon (Si) substrate can be used for the outer frame portion 605. The laminate constituting the vacuum membrane holder 601 can be formed by using a semiconductor process (MEMS process). Preferably, both the insulating layer 603 and the conductive layer 604 have a uniform thickness and do not have an uneven structure on the surface (more specifically, an unevenness to the extent that the contrast of the unevenness on the surface does not appear when observed with a scanning electron microscope is acceptable, and the size of the unevenness on the surface at this time is about 10 nm or less). This can be achieved by using a semiconductor process to form the laminate, for example, by forming a metal thin film forming the conductive layer 604 by sputtering.

Next, the detection principle of the detector 602 will be described with reference to FIG. 2. When the vacuum membrane holder 601 is irradiated with the electron beam 12, the electron beam 12 penetrates the conductive layer 604 and the insulating layer 603 and reaches the sample 200. Signal electrons such as SE (Secondary Electron) and BSE (Back-Scattered Electron) are emitted from the sample 200.

Of these, BSE 606, which has the same energy as the electron beam 12 at the maximum value, penetrates the insulating layer 603 and the conductive layer 604 and hits a column structure 607. As an example, the column structure 607 may be a part of an objective lens. SE 608 is generated from the column structure 607. In Example 1, a positive voltage with respect to the potential of the column structure 607 is applied to the conductive layer 604 by a bias power supply unit 20. Due to this potential difference, the SE 608 having a negative charge is accelerated toward the conductive layer 604 and is absorbed by the conductive layer 604 to flow into the bias power supply unit 20.

The signal detection unit 50 detects the current flowing into the bias power supply unit 20 and outputs a voltage signal corresponding to the amount of the current to the main control unit 14. Since the amount of the SE 608 generated and the amount of the current detected change according to the amount of the BSE 606 generated, a BSE image of the sample can be obtained.

The permeability of the vacuum membrane (insulating layer 603 and conductive layer 604) by the electron beam 12 depends on its acceleration voltage. From the above detection principle, in Example 1, the acceleration voltage of the electron beam 12 is preferably set to a high acceleration voltage that passes through the insulating layer 603 and the conductive layer 604.

A detailed configuration example of the bias power supply unit 20 and the signal detection unit 50 constituting the signal detection circuit will be described in Example 2 which can be similarly configured. Further, also in the configuration of Example 1, when the vacuum membrane holder 601 is irradiated with the electron beam 12, conductive layer originated carriers and insulating layer originated carriers, which will be described later, are generated. However, by arranging the insulating layer 603 and the sample at a distance, the electric field intensity in the insulating layer 603 becomes substantially uniform. Further, since both the insulating layer 603 and the conductive layer 604 have a uniform thickness and do not have an uneven structure on the surface, in an internal region 609 where the outer frame portion 605 is not provided, the conductive layer originated carriers and the insulating layer originated carriers are uniform regardless of the scanning position, and thus, what mainly contributes to the image contrast is the BSE emitted from the sample.

Example 2

FIG. 3 shows a configuration diagram of the scanning electron microscope according to Example 2. A housing 10 includes a column in which an electron optics system for irradiating a sample to be observed with an electron beam is built-in and a sample chamber in which a sample is placed. The electron optics system is arranged on a column and includes the condenser lens 60 and the objective lens 62 that focus the electron beam 12 emitted from the electron gun 11 to irradiate the sample 200 as a minute spot, the astigmatism corrector 61 that corrects the astigmatism of the electron beam 12, the deflector 13 that scans the electron beam 12 two-dimensionally on the sample 200, and the image shifter 63 that shifts the scanning center position of the electron beam 12 two-dimensionally on the sample 200. The sample chamber is provided with a stage 64 that can be moved three-dimensionally. The sample 200 is held in the sample chamber 100, and the sample chamber 100 is connected to a signal detection circuit to form a detector 101. The sample chamber 100 is placed on the stage 64 via an insulator spacer 65. As a result, the sample chamber 100 is placed on the stage 64 in a state of being electrically insulated from the stage 64. The electron optics system and the stage 64 are controlled by the main control unit 14.

Further, a detection signal (voltage signal) from the detector 101 is input to the main control unit 14. The configuration of the detector 101 will be described later, but the voltage signal output from the signal detection unit 50 of the detector 101 is converted into pixel gradation data according to the intensity thereof for each irradiation position of the electron beam 12 to the sample chamber 100 and is output to the computer 15 as image data every time one frame scan is completed, one line scan is completed, or one pixel scan is completed, depending on the deflection speed. The image data is displayed on the display unit 16 by the computer 15.

The configuration of the detector 101 will be described with reference to the configuration diagram of the detector 101 shown in FIG. 4A. The sample chamber 100 (the cross-sectional view is shown in the figure) is a laminated body of several mm to a dozen mm square. The sample chamber 100 is provided with a membrane that isolates the sample 200 from the vacuum in the sample chamber on the irradiation surface side of the electron beam 12. The membrane includes at least two layers of a first insulating layer 110 on the sample 200 side and a conductive layer 120 on the side where the electron beam 12 is incident. The first insulating layer 110 is supported by an outer frame portion 130 provided for the purpose of maintaining strength, and the conductive layer 120 is uniformly formed on the outer frame portion 130 and the first insulating layer 110. The sample 200 is held between the membrane and a sample holding layer facing the membrane. The sample holding layer includes at least two layers of a second insulating layer 111 on the sample 200 side and a substrate 131 supporting the second insulating layer 111. The second insulating layer 111 is provided to prevent corrosion of the substrate 131 by the sample 200. Further, an intermediate layer 115 is provided in order to form a holding space for the sample 200 by providing a predetermined gap between the membrane (first insulating layer 110) and the sample holding layer (second insulating layer 111). The intermediate layer 115 also serves to isolate the sample 200 from the vacuum in the sample chamber. A reference potential portion 140 is provided in contact with the sample holding layer (substrate 131). As will be described later, the potential of the reference potential portion 140 is a reference potential when the potential is applied to the conductive layer 120. As will be described later, the potential applied to the conductive layer 120 is supplied by the bias power supply unit 20.

The material of each layer is illustrated. A silicon nitride (SiN) film can be used for the first insulating layer 110, a metal thin film such as tungsten or tantalum can be used for the conductive layer 120, and a silicon (Si) substrate can be used for the outer frame portion 130. Further, a silicon nitride (SiN) film or a silicon oxide (SiO$_2$) film can be used as the second insulating layer 111, and a silicon substrate can be used as the substrate. Further, an insulating film such as a silicon oxide (SiO$_2$) film can be used for the intermediate layer 115, and a metal layer such as aluminum or copper can be used for the reference potential portion 140. The laminate constituting the sample chamber 100 can be formed by using a semiconductor process (MEMS process). According to the detection principle of the detector described later, preferably, both the first insulating layer 110 and the conductive layer 120 have a uniform thickness and do not have an uneven structure on the surface (more specifically, an unevenness to the extent that the contrast of the unevenness on the surface does not appear when observed with a scanning electron microscope is acceptable and the size of the unevenness on the surface at this time is about 10 nm or less). This can be achieved by using a semiconductor process to form the laminate, for example, by forming a metal thin film forming the conductive layer 120 by sputtering.

The intermediate layer 115 does not have to have a physical structure. In this case, since it is necessary to isolate the sample 200 from the vacuum inside the sample chamber, the sample chamber 100 is arranged in a box-shaped vacuum partition as shown in FIG. 4B. The vacuum partition is composed of a vacuum partition lower part 520 and a vacuum partition upper part 521. The vacuum partition lower part 520 is an insulator such as acrylic, and the vacuum partition upper part 521 is a conductor such as aluminum. The vacuum partition lower part 520 and the vacuum partition upper part 521 are connected via a sealing material 523 for airtightness and maintain the space around the sample 200 at atmospheric pressure or a vacuum degree lower than that of the sample chamber. In this case, the gap between the first insulating layer 110 and the second insulating layer 111 is held by the sandwiched sample 200.

Since the electron beam irradiation surface of the sample chamber 100 needs to be opened to the vacuum in the sample chamber, an opening 501 for passing the electron beam is provided on the upper surface of the vacuum partition upper part 521. The vacuum partition upper part 521 is electrically connected to the conductive layer 120, and the current signal is detected from the vacuum partition upper part 521. The vacuum partition lower part 520 includes a connector 524 that takes out a lead wire 525 for keeping the reference potential portion 140 at a predetermined potential.

Next, the detection principle of the detector 101 will be described with reference to FIG. 4A. When the sample chamber 100 is irradiated with the electron beam 12, the electron beam 12 is scattered in the conductive layer 120 and the first insulating layer 110. Carriers (insulating layer originated carriers) 300 are generated in an electron beam scattering region 17 of the first insulating layer 110. The principle of generation of the insulating layer originated carriers 300 will be described later with reference to FIG. 8. The amount of the insulating layer originated carriers 300 generated depends on the electric field intensity generated in the first insulating layer 110 and the sample 200 immediately below the first insulating layer 110. The insulating layer originated carriers 300 flow into the bias power supply unit 20 via the conductive layer 120.

On the other hand, signal electrons 301 including SE and BSE are emitted into a vacuum from the electron beam scattering region 17 of the conductive layer 120. As a result, inside the conductive layer 120, carriers (conductive layer originated carriers) 302 corresponding to the balance between the incident electron beam 12 and the number of generated signal electrons 301 are generated. For example, when the signal electron number N is generated for electron number 1 of the electron beam 12, the conductive layer originated carriers 302 of (N−1) is generated. Here, when N is larger than 1, the polarity of the conductive layer originated carriers 302 becomes positive as shown in FIG. 4A. The conductive layer originated carriers 302 also flow into the bias power supply unit 20.

In this way, the sum of the insulating layer originated carriers 300 and the conductive layer originated carriers 302 flows into the bias power supply unit 20. The signal detection unit 50 detects the carriers that have flowed into the bias power supply unit 20 and outputs a voltage signal corresponding to the amount of carriers to the main control unit 14.

When the scanning range of the electron beam 12 is an internal region 310 where the outer frame portion 130 is not provided, the amount of the insulating layer originated carriers 300 generated varies depending on the sample 200. On the other hand, the amount of the conductive layer originated carriers 302 generated is constant. This is because, as described above, the conductive layer 120 has a uniform structure with no unevenness on the surface, and thus, the amount of signal electrons 301 generated is constant. The magnitude of the contrast of the image data depends on the magnitude of the voltage signal (=amount of carriers) from the signal detection unit 50, but only the insulating layer originated carriers 300 are involved in the change in the amount of carriers. Therefore, the contrast depending on the sample 200 appears in the image data.

The spread of the electron beam scattering region 17 by the electron beam 12 depends on the acceleration voltage of the electron beam 12. From the above detection principle, in this embodiment, the acceleration voltage of the electron beam 12 is preferably set to a low acceleration voltage that hardly penetrates the first insulating layer 110 in the internal region 310.

Further, as described above, in order to generate an electric field in the first insulating layer 110 and the sample 200 immediately below the first insulating layer 110, a bias voltage is applied to the conductive layer 120 by the bias power supply unit 20 to ground the reference potential unit 140. Here, it is sufficient that the potentials of the bias power supply unit 20 and the reference potential unit 140 are determined so that a desired electric field intensity is generated in the first insulating layer 110 and the sample 200 immediately below the first insulating layer 110, and the method of applying the respective potentials are arbitrary. For example, the bias power supply unit 20 may be set as the ground potential, and a voltage having a polarity opposite to the bias voltage in the example of FIG. 4A may be applied to the reference potential unit 140. Alternatively, the bias voltage and the voltage applied to the reference potential portion may be determined so that a predetermined voltage is generated between the conductive layer 120 and the reference potential portion 140, using a certain potential of the system as the ground potential.

There is an advantage that the detection gain in the signal detection unit 50 becomes large as the bias voltage (potential difference between the conductive layer 120 and the reference potential unit 140) is large. However, it is possible to detect even if the potentials given to the conductive layer 120 and the reference potential portion 140 are the same potential. Even in this case, an electric field can be generated in the first insulating layer 110 and the sample 200 immediately below the first insulating layer 110 by the charge generated in the first insulating layer 110 by the electron beam 12 penetrating the conductive layer 120.

By the way, when the scanning range of the electron beam 12 is in the outer frame portion region 311, the insulating layer originated carriers 300 do not occur. This is because the electron beam 12 does not pass through the outer frame portion 130 and does not reach the first insulating layer 110. On the other hand, the conductive layer originated carriers 302 change depending on the structure of the outer frame portion 130. This is because, as is well known, the amount of SE or BSE generated as signal electrons changes by reflecting the three-dimensional structure of the irradiated body. That is, when the scanning range of the electron beam 12 is in the outer frame portion region 311, only the conductive layer originated carriers 302 flow into the bias power supply unit 20 and the signal detection unit 50 detects the carriers that have flowed into the bias power supply unit 20 and outputs a voltage signal corresponding to the amount of carriers to the main control unit 14. As a result, the contrast depending on the three-dimensional structure of the irradiated body appears in the image data and an image equivalent to the absorbed current image in the SEM can be obtained.

From the above, in the detector 101, the scanning range of the electron beam 12 can acquire a signal originating from the sample 200 in the internal region 310 of the sample chamber 100, and the scanning range of the electron beam 12 can acquire a signal originating from the three-dimensional structure of the outer frame portion 130 in the outer frame portion region 311 of the sample chamber 100. Therefore, the adjustment of the focus of the electron beam 12 and the astigmatism correction, which are performed using the three-dimensional structure of the outer frame portion 130 to optimize the electron beam 12 to be irradiated to the sample chamber 100, and the observation of the sample 200 with the optimized electron beam 12 can be performed with the same output of detector 101. Although the focus adjustment of the electron beam 12 and the astigmatism correction can be performed using the SE detector or BSE detector provided in the scanning electron microscope, in this case, the detector must be switched by adjusting the electron beam and observing the sample. In this embodiment, since the adjustment of the electron beam and the observation of the sample can be performed without switching the detector, the convenience is improved and the observation throughput is improved.

Hereinafter, a procedure for the user to manually perform the focus adjustment of the electron beam 12 and the astigmatism correction will be described using FIGS. 5 and 6A and 6B.

FIG. 5 shows the top surface shape (part) of the sample chamber 100. The upper part is a top view of the sample chamber 100 and the lower part is a cross-sectional view. The lower cross-sectional view corresponds to the sectional shape of the alternate long and short dash line portion shown by A-A in the top view. The outer frame portion 130 includes a window portion 313 recessed an inverted pyramid shape and the internal region 310 corresponding to the bottom surface of the window portion 313 has a rectangular shape. Here, at respective vertexes of the internal region 310, rectangular regions each including the internal region 310 and an inclined surface in contact with the internal region 310 are referred to as outer frame edge portions 314 to 317. Further, for the sake of simplicity, in this example, the sample chamber 100 is not filled with the sample, and the holding space for the sample is evacuated.

FIGS. 6A and 6B show an example of a display unit screen 400 displayed on the display unit 16. The display unit screen 400 includes a condition display unit 401 showing optical conditions such as an acceleration voltage and an observation magnification, position information of an observation place, an SEM image display unit 402, and an autofocus button 404 described later. FIG. 6A is a display unit screen when the entire inverted pyramid-shaped window portion 313 of the outer frame portion 130 is in the field of view. An image 313a of the inverted pyramid-shaped window portion 313 and an image 310a of the internal region 310 are observed in the central portion thereof. FIG. 6B is a display unit screen when an image 314a of one outer frame edge portion 314 of the inverted pyramid-shaped window portion 313 shown in FIG. 6A is enlarged and observed.

As shown in FIGS. 6A and 6B, since the SEM image based on the voltage signal of the detector 101 detects, as the absorption current, the same signal electron-derived information as the detection target of the scanning electron microscope, the structure of the outer frame portion 130, specifically, the inverted pyramid shape appears as a contrast. On the other hand, in the internal region 310, since the sample does not exist under the first insulating layer 110 in this example, the contrast does not appear. When actually observing a sample, that is, when the sample 200 as shown in FIG. 4A is held under the first insulating layer 110 of the internal region 310, a contrast reflecting the sample 200 appears in the image 310a of the internal region 310 of the SEM image of FIGS. 6A and 6B.

After starting the observation, the user sets the conditions on the GUI or by using an operation tool at the user's hand (not shown). Specifically, first, as shown in FIG. 6A, the field of view and the observation magnification are set so that the entire inverted pyramid-shaped window portion 313 is in the field of view, and the focus condition and astigmatism correction are adjusted so that an SEM image with high sharpness can be obtained at the observation magnification. The main control unit 14 controls each part of the device according to the conditions set by the user. Specifically, when setting the observation magnification, the main control unit 14 controls the deflector 13 so that the electron beam 12 scans the observation magnification region desired by the user. When setting the observation field of view, the main control unit 14 controls the stage 64 or the image shifter 63 to move the observation field of view two-dimensionally so as to obtain the field of view desired by the user. When adjusting the focus condition and astigmatism correction, the main control unit 14 controls the objective lens 62 and the astigmatism corrector 61, respectively, and adjusts the focused state of the electron beam 12 so as to obtain the sharpness desired by the user.

After adjusting the focus condition and astigmatism correction described above, the user sets a desired observation magnification and a desired field of view on the GUI or by using an operation tool at the user's hand (not shown), observes the internal area 310, and acquires an SEM image of the sample as a target.

When it becomes necessary to adjust the focus condition and the astigmatism correction during high-magnification observation, the above-mentioned procedure may be performed using the observed SEM image of the outer frame edge portion 314 as shown in FIG. 6B at the desired observation magnification, thereby setting each condition so as to obtain the sharpness desired by the user.

As described above, the focus condition and the astigmatism correction may be manually adjusted by the user but may be automatically adjusted. Hereinafter, a procedure for automatically adjusting the focus condition of the electron beam 12 and the astigmatism correction will be described with reference to FIGS. 6A and 6B and FIG. 7. Hereinafter, this function will be referred to as an autofocus function. FIG. 7 shows an example of a flowchart of the autofocus function.

The user determines a desired field of view to be observed and an observation magnification and starts the autofocus processing by pressing the autofocus button 404 (see FIGS. 6A and 6B) on the GUI or operating an operation tool at the user's hand (not shown).

In step S1, the computer 15 assigns 0 to the number of trials N.

In step S2, the main control unit 14 controls the deflector 13, the image shifter 63, and the stage 64 to acquire a low-magnification image as shown in FIG. 6A.

In step S3, the computer 15 performs image processing on the low-magnification image, determines the locations of the four outer frame edge portions 314 to 317 (see FIG. 5), and stores the coordinates thereof.

In step S4, the main control unit 14 controls the image shifter 63 and the stage 64 and moves the field of view so that the center of the field of view is the center of any of the four outer frame edge portions 314 to 317. At this time, as the outer frame edge portion to be selected as the movement destination, it is preferable to select the outer frame edge portion closest to the target observation target portion.

In step S5, the main control unit 14 controls the deflector 13 to acquire a high-magnification image as shown in FIG. 6B at a desired observation magnification.

In step S6, the computer 15 performs image processing on the high-magnification image and calculates the sharpness evaluation value.

In step S7, the computer 15 compares the sharpness evaluation value with a threshold value stored in advance and determines the success or failure. Specifically, the computer 15 determines a failure if the sharpness evaluation value exceeds the threshold value, adds 1 to the number of trials (step S10), and compares the number of trials N with the upper limit of the number of trials stored in advance (Step S11). If the number of trials N is less than the upper limit of the number of trials, the main control unit 14 controls the objective lens 62 and the astigmatism corrector 61 to change the focused state of the electron beam 12 (step S12), and again executes the processes from step S5. On the other hand, if the number of trials N is equal to or greater than the upper limit of the number of trials, error processing is performed and the processing ends (step S13). Specifically, as the error processing, the main control unit 14 controls the objective lens 62 and the astigmatism corrector 61 to return the focused state of the electron beam 12 to the condition before the start of the autofocus processing, and the computer 15, on the display unit screen 400, notifies the user that the autofocus processing has failed.

In step S7, if the sharpness evaluation value is equal to or less than the threshold value, the computer 15 determines success and proceeds to step S8.

In step S8, the main control unit 14 controls the deflector 13, the image shifter 63, and the stage 64 so as to obtain the observation magnification and the observation field of view desired by the user.

In step S9, the main control unit 14 captures an image of the desired field of view at the desired magnification, the computer 15 displays the image information on the display unit screen 400, stores the image information in the internal storage, and ends the processing.

As described above, in the scanning electron microscope according to the present example, the focus adjustment and the astigmatism correction can be easily performed based on the detection signal from the detector 101 without switching to another detector image such as the SE detector possessed by the scanning electron microscope.

Next, with reference to FIG. 8, the principle of generating the insulating layer originated carriers 300 that contribute to the contrast of the target sample 200, and the configuration example of the signal detection circuit will be described in detail. In the example of FIG. 8, the bias power supply unit 20 (see FIG. 4A) is composed of a constant voltage source 21 and a voltage follower circuit 22, and the signal detection unit 50 is composed of a resistor 23 and an amplifier 51. Specifically, the constant voltage source 21 is connected to the positive input terminal of the voltage follower circuit 22, and the conductive layer 120 of the sample chamber 100 is connected to the negative input terminal of the voltage follower circuit 22. The output terminal of the voltage follower circuit 22 and the conductive layer 120 of the sample chamber 100 are connected via the resistor 23, and the potential difference between both ends of the resistor 23 is amplified by the amplifier 51 and is output as a voltage signal.

When a bias voltage is applied to the conductive layer 120 by the constant voltage source 21 and the voltage follower circuit 22, an electric field is generated between the reference potential portion 140 and the conductive layer 120 which are included in the sample chamber 100. That is, an electric field is generated in the first insulating layer 110, and the sample 200 immediately below the first insulating layer 110. It is assumed that the sample 200 is, for example, water 201 in which cells 202 that can be regarded as a protein complex are dispersed. Since the permittivity of water is about 80, while the permittivity of protein is 2 to 3, the potential gradient of the water portion, that is, the electric field intensity is milder than the electric field intensity of the cell portion.

Here, attention is paid to the two-dimensional electric field intensity distribution inside the first insulating layer 110 along the interface between the first insulating layer 110 and the sample 200 in the internal region 310. In the region where the cells 202 are attached near the interface with the first insulating layer 110 in the sample 200, the electric field intensity in the first insulating layer 110 just above the interface is relatively low by the amount that the electric field intensity in the cells is increased. On the other hand, in the region where there are no cells near the interface between the sample 200 and the first insulating layer 110, the electric field intensity in the first insulating layer 110 immediately above the interface in that region is relatively high. As described above, the two-dimensional electric field intensity distribution inside the first insulating layer 110 along the interface between the first insulating layer 110 and the inside of the sample 200 in the internal region 310 reflects the distribution of the dielectric constant near the interface.

When the electron beam 12 is set to an acceleration voltage that hardly penetrates the first insulating layer 110, the electron beam 12 does not reach the sample 200, but the electron beam scattering region 17 spreads in the first insulating layer 110 and scattering of primary electrons with energy in that range occurs. An electron-hole pair is generated because the primary electrons scattered in the first insulating layer 110 impart energy about three times the work function of the material of the first insulating layer 110. For example, when the first insulating layer 110 is a silicon nitride film, its work function is about 3 eV. Therefore, an electron-hole pair is generated by applying about 9 eV of energy from the scattered primary electrons.

When the thicknesses of the first insulating layer 110 and the conductive layer 120 are made uniform, the depth of the electron beam scattering region 17 of the incident electron beam 12 is uniform regardless of the scanning region, and the energy distribution of the primary electron in the electron beam scattering region 17 is also uniform regardless of the scanning region. Therefore, the number of electron-hole pairs generated in the first insulating layer 110 is also uniform regardless of the scanning region.

However, the ratio at which the generated electron-hole pairs are separated as carriers without recombination depends on a two-dimensional electric field intensity distribution inside the first insulating layer 110 along the interface between the first insulating layer 110 and the sample 200. As a result, the amount of the insulating layer originated carriers 300 detected at each irradiation position of the electron beam 12 to the sample chamber 100 reflects the distribution of the dielectric constant in the sample 200. This is the principle of contrast generation of the sample to be observed in the scanning electron microscope according to this example.

When the output of the constant voltage source 21 is negative with respect to the potential of the reference potential portion 140, the same negative voltage is also applied to the conductive layer 120. Therefore, the positive charge in the electron-hole pair generated as shown in FIG. 8 in the above is separated on the conductive layer 120 side and flows into the voltage follower circuit 22. Since the input impedance of the negative input terminal of the voltage follower circuit 22 is much higher than that of the output, the carriers that have flowed in through the conductive layer 120 will flow through the resistor 23. At this time, a potential difference corresponding to the amount of carriers is generated at both ends of the resistor 23 and the potential difference can be detected by the amplifier 51. As a specific form of the amplifier 51, an instrumentation amplifier can be mentioned.

When the potential of the reference potential portion 140 and the output of the constant voltage source 21 are the same potentials, the charge generated by the electron beam 12 in the first insulating layer 110 as described above becomes the electric field supply source. Since the electron charge is negative, the charging potential is negative with respect to the reference potential portion 140. Therefore, also, in this case, a signal with the same polarity as the polarity when the output of the constant voltage source 21 is negative with respect to the potential of the reference potential portion 140 is obtained.

Further, a potential difference corresponding to the amount of carriers is generated at both ends of the resistor 23, but it is possible to maintain the potential of the conductive layer 120 to become equal to the output of the constant voltage source 21 by connecting the voltage follower circuit 22 shown in FIG. 8. That is, the potential difference between the conductive layer 120 and the reference potential portion 140 can be maintained constant regardless of the amount of electron-hole pairs generated in the first insulating layer 110. However, in actual use, the potential difference generated across the resistor 23 in correspondence to the amount of carriers is sufficiently smaller than the voltage across the constant voltage source 21, and even when the resistor 23 is connected to the outside of the negative feedback of the voltage follower circuit 22, that is, when the resistor 23 is connected between the conductive layer 120 and the connection node between the negative input terminal and the output terminal of the voltage follower circuit 22, the potential of the conductive layer 120 can be regarded as constant and the signal can be detected in the same manner as the signal detection circuit shown in FIG. 8

The signal detection circuit shown in FIG. 8 is suitable for sample observation at a high frame rate because an amplifier can be connected to the conductive layer 120 directly above the carrier generation source to lower the signal path impedance. Further, the impedance of the signal path until the electron-hole pair generated in the electron beam scattering region 17 is separated by the electric field applied to the first insulating layer 110 and flows into the voltage follower circuit 22 as a carrier does not depend on the sample 200. Therefore, even if the content of the sample 200 is changed, it is not necessary to search for the scanning speed of the electron beam 12 suitable for the sample again, and high throughput observation can be realized by using a high frame rate image.

Generally, when the number of frames per second (fps) is 12 or more, a person can recognize the series of images as a video. When observing a sample with a scanning electron microscope, the observation magnification is set so that the size of the shape and material of the sample can be visually recognized on the observation image, that is, the size is at least several pixels or more. For example, under the display conditions of an image size of 640 pixels×480 pixels and a frame rate of 12 fps, the response frequency band of the signal detection circuit required to display the sample shape of several pixels or more with high image quality is about 700 kHz.

FIG. 9 shows the circuit simulation results of the response frequency characteristics when the current-voltage conversion rate is $10^9$ [V/A] for the signal detection circuit of this example. The graph in FIG. 9 is standardized so that the current-voltage conversion rate $10^9$ [V/A] is 0 dB. The high cutoff frequency of the signal detection circuit is about 1.4 MHz, which exceeds about 700 kHz (one-point chain line in FIG. 9), which is the response frequency band of the detection circuit required for making a video of a series of images described above, that is, for moving image observation. This makes it possible not only to acquire still images of samples but also to acquire motions and morphological changes unique to living biological samples as moving images.

The signal detection circuit can be realized not only in the example of FIG. 8 but also in another configuration. In the example of FIG. 10, the bias power supply unit 20 (see FIG. 4A) is composed of a constant voltage source 24, and the signal detection unit 50 is composed of a transimpedance amplifier 52. As a simple form of the constant voltage source 24, a battery can be mentioned. The return current corresponding to the carriers generated as described above and flowing into the constant voltage source 24 via the conductive layer 120 flows through the transimpedance amplifier 52, whereby a voltage signal corresponding to the amount of carriers can be detected.

In the example of FIG. 11, the bias power supply unit 20 (see FIG. 4A) is composed of the constant voltage source 24, and the signal detection unit 50 is composed of a resistor 25 and a voltage amplifier 53. One terminal of the constant voltage source 24 is connected to the conductive layer 120, and the other terminal is connected to one terminal of the voltage amplifier 53. Further, the resistor 25 is connected between the other terminal of the constant voltage source 24 and the reference potential portion. The return current corresponding to the carriers generated as described above and flowing into the constant voltage source 24 via the conductive layer 120 flows through the resistor 25, and the voltage amplifier 53 amplifies the potential difference between both ends of the resistor 25, whereby a voltage signal corresponding to the amount of carriers can be detected. The potential of the conductive layer 120 in the example of FIG. 11 fluctuates by the amount of the potential difference between both ends of the resistor 25, but in actual use, the amount of fluctuation is sufficiently smaller than the voltage across the constant voltage source 24 and the potential of the conductive layer 120 can be considered constant.

Example 3

Another configuration example of the detector will be described with reference to FIG. 12. In the sample chamber 900 of the detector 901, the partition provided on the irradiation surface side of the electron beam 12 has the same structure as the detector shown in FIG. 4A, but the structure of the sample holding layer is different. The sample holding layer includes a second insulating layer 111 and a second outer frame portion 911 that supports the second insulating layer 111 on the sample 200 side. A window portion 912 is provided in the second outer frame portion 911, and the second insulating layer 111 is exposed to the outside atmosphere in a second inner region 913 corresponding to the bottom portion of the window portion 912. Desirably, a second internal region 913 is formed in a region that is the same as the first internal region 310 or covers the first internal region 310 when viewed from the upper surface of a sample chamber 900. A silicon nitride (SiN) film can be used as the material of the second insulating layer 111, and a silicon (Si) substrate can be used as the material of the second outer frame portion 911.

Further, in this example, the structure of the reference potential portion is different. A reference potential portion 910 that provides the reference potential to the conductive layer 120 has a rod shape and is arranged close to the second internal region 913. According to this configuration, the distance between the conductive layer 120 and the reference potential portion 910 can be reduced, and thus, the electric field intensity can be increased even when the same potential is applied to the conductive layer 120 as compared with the configuration of Example 2.

As for the sample chamber of Example 3, the sample chamber 900 is arranged in the same box-shaped vacuum partition as in FIG. 4B and the space around the sample chamber 900 may be maintained at atmospheric pressure or a vacuum degree lower than that of the sample chamber. In this case, the configuration is the same as that of Example 4 (FIG. 14), and a detection electrode 820 of Example 4 may be replaced with the reference potential portion 910.

Example 4

Another configuration example of the detector will be described with reference to FIG. 13. In this example, as in Example 3, the sample holding layer includes the second insulating layer 111 and a second outer frame portion 810 that supports the second insulating layer 111 on the sample 200 side. A window portion 811 is provided in the second outer frame portion 810, and the second insulating layer 111 is exposed to the outside atmosphere in a second inner region 812 corresponding to the bottom portion of the window portion 811. Desirably, the second internal region 812 is formed in a region that is the same as the first internal region 310 or covers the first internal region 310 when viewed from the upper surface of a sample chamber 800. A silicon nitride (SiN) film can be used as the material of the second insulating layer 111, and a silicon (Si) substrate can be used as the material of the second outer frame portion 810.

Further, in addition to the signal detection circuit (first signal detection circuit 802) described in Example 2, a detection electrode 820 is provided close to the second internal region 812, and a second signal detection circuit 821 that detects an electric signal generated in the detection electrode 820 caused by the insulating layer originated carriers 300. In this example, the detection electrode 820 plays a role of the reference potential portion that provides a reference potential with respect to the conductive layer 120 in the configuration of the detector of FIG. 4A. The sample chamber 800 is placed on the stage 64 with the detection electrode 820 and the second outer frame portion 810 electrically insulated from the stage 64. Specifically, as shown in FIG. 3, it is placed on the stage 64 via the insulator spacer 65. The detection electrode 820 is connected to the second signal detection circuit 821, and the second signal detection circuit 821 outputs the electric signal detected by the detection electrode 820 to the main control unit 14 as a voltage signal corresponding to the intensity thereof.

The voltage signal output from the second signal detection circuit 821 for each deflection position of the electron beam 12 to the sample chamber 800 is converted by the main control unit 14 into pixel gradation data according to the intensity thereof and is output to the computer 15 as image data every time one frame scanning is completed, every time one line scanning is completed, or every time one pixel scanning is completed, depending on the deflection speed. The image data is displayed on the display unit 16 by the computer 15. With such a configuration, it is possible to simultaneously acquire two types of image data based on the signal obtained from the first signal detection circuit 802 and the signal obtained from the second signal detection circuit 821.

The outside atmosphere of the sample chamber 800 may be the same vacuum atmosphere as the sample chamber. Further, for example, the sample chamber 800 may be arranged in the same box-shaped vacuum partition as in FIG. 4B and the space around the sample chamber 800 may be maintained at atmospheric pressure or a vacuum degree lower than that of the sample chamber. The state is shown in FIG. 14. The vacuum partition is composed of a vacuum partition lower part 920 and a vacuum partition upper part 921. The vacuum partition lower part 920 is an insulator such as acrylic, and the vacuum partition upper part 921 is a conductor such as aluminum. The vacuum partition lower part 920 and the vacuum partition upper part 921 are connected via a sealing material 923 for airtightness, and hold the space around the sample 200 at atmospheric pressure or a vacuum degree lower than that of the sample chamber.

The vacuum partition upper part 921 is electrically connected to the conductive layer 120, and the electric signal is detected from the vacuum partition upper part 921. The detection electrode 820 is fixed to the vacuum partition lower part 920 so as to be close to the second internal region 812 of the sample chamber 800.

In this embodiment, two types of images based on the signal from the first signal detection circuit 802 and the signal from the second signal detection circuit 821 can be simultaneously acquired and compared. For example, when a peculiar contrast different from the image obtained by the second signal detection circuit 821 occurs in a specific portion of the image obtained by the first signal detection circuit 802, there is a high possibility that a foreign substance exists on the vacuum side surface of the conductive layer 120.

As described above, the signal obtained by the first signal detection circuit 802 includes the information originating from the signal electron emitted into the vacuum by the irradiation of the electron beam 12 (conductive layer originated carriers) and the information originating from the sample 200 (insulating layer originated carriers), whereas the signal obtained by the second signal detection circuit 821 contains only the information originating from the sample 200 without including the information originating from the signal electrons. Therefore, for example, when minute metal particles are present as foreign substances on the vacuum side surface of the conductive layer 120, more signal electrons (mainly SE) are generated around the metal particles than on other surfaces. Therefore, at the portion where the metal particles are present, the voltage signal detected by the first signal detection circuit 802 becomes larger as the number of conductive layer originated carriers 302 increases. On the other hand, the presence of the metal particles causes the electron beam to lose energy and the probability of reaching the first insulating layer 110 around the metal particles decreases. Therefore, the number of insulating layer originated carriers 300 generated in the first insulating layer 110 is reduced as compared with the surroundings. As a result, the voltage signal detected by the second signal detection circuit 821 at the portion where the metal particles are present becomes smaller due to the phenomenon of the insulating layer originated carriers 300. In this way, when there is a difference between the two types of obtained images, it can be determined that there is a high possibility that a foreign substance is present on the vacuum side surface of the conductive layer 120 at the portion where the difference has occurred.

As described above, by simultaneously acquiring and comparing two types of image data with such a configuration, it is possible to obtain information that can be used as a material for determining whether the contrast obtained is due to the sample 200 to be observed, or a foreign substance existing on the vacuum side surface of the conductive layer 120, and the convenience of observation can be improved.

REFERENCE SIGNS LIST

10: housing
11: electron gun
12: electron beam
13: deflector
14: main control unit
15: computer
16: display unit
17: electron beam scattering region
20: bias power supply unit
21: constant voltage source
22: voltage follower circuit
23: resistor
24: constant voltage source
25: resistor
50: signal detector
51: amplifier
52: transimpedance amplifier
53: voltage amplifier
60: capacitor lens
61: astigmatism corrector
62: objective lens
63: image shifter
64: stage
65: insulator spacer
100, 800, 900: sample chambers
101, 602, 801, 901: detectors
110: first insulating layer
111: second insulating layer
115: intermediate layer
120, 604: conductive layers
130, 605, 810, 911: outer frame portions
131: substrate
140, 910: reference potential portions
200: sample
300: insulating layer originated carrier
301: signal electron
302: conductive layer originated carrier
310, 812, 913: internal regions
311: outer frame portion region
313, 811, 912: window parts
314 to 317: outer frame edges
400: display unit screen
401: condition display
402: SEM image display
404: autofocus button
501: opening
520, 920: vacuum partition lower parts
521, 921: vacuum partition upper parts
523, 923: sealing material
524: connector
525: lead wire
802, 821: signal detection circuit
820: detection electrode
600: sample chamber
601: vacuum membrane holder
603: insulating layer
606: BSE
607: column structure
608: SE
610: column.

The invention claimed is:

1. A charged particle beam device comprising:
an electron optics system;
a stage;
a sample chamber holding a sample and including a first insulating layer that is in contact with the sample, and a conductive layer formed on the first insulating layer;
a signal detection circuit connected to the conductive layer and detecting a current flowing through the conductive layer; and
a main control unit for controlling the electron optics system and the stage, wherein
the main control unit irradiates the conductive layer of the sample chamber placed on the stage with an electron beam from the electron optics system and is input with a detection signal from the signal detection circuit.

2. The charged particle beam device according to claim 1, wherein
the main control unit controls irradiation of the sample with an electron beam of the electron optics system at a plurality of deflection positions and converts a detection signal from the signal detection circuit into pixel gradation data according to the intensity thereof for each of the plurality of deflection positions of the electron beam.

3. The charged particle beam device according to claim 1, wherein
the sample chamber includes a first outer frame portion that supports the first insulating layer,
the first outer frame portion includes a first window portion recessed in an inverted pyramid shape in the scanning range of the electron beam to the sample chamber placed on the stage, and
the conductive layer is formed on the first insulating layer in a first internal region which is a bottom surface of the first window portion and is formed on the first outer frame portion which is outside of the first internal region.

4. The charged particle beam device according to claim 3, wherein
the sample chamber includes a second insulating layer provided facing the first insulating layer and forming a holding space for holding the sample, a substrate supporting the second insulating layer, and a reference potential portion provided in contact with the substrate and providing a reference potential, and
the sample chamber is placed in a state of being electrically insulated from the stage.

5. The charged particle beam device according to claim 3, wherein
the sample chamber includes a second insulating layer provided facing the first insulating layer and forming a holding space for holding the sample, a second outer frame portion supporting the second insulating layer, and a reference potential portion providing a reference potential,
in a second internal region which is the bottom surface of a second window portion formed in the second outer frame portion in the same region as the first internal region or a region covering the first internal region when viewed from the upper surface of the sample chamber, the second insulating layer is exposed to an atmosphere outside of the second insulating layer and the reference potential portion is arranged in the second internal region, and
the sample chamber is placed in a state of being electrically insulated from the stage.

6. The charged particle beam device according to claim 4, wherein
the signal detection circuit includes a bias power supply unit that applies a predetermined bias voltage to the conductive layer, and a signal detection unit that outputs a voltage signal which occurs by irradiating the conductive layer with an electron beam and corresponds to the amount of carriers flowing into the bias power supply unit.

7. The charged particle beam device according to claim 6, wherein
the bias power supply unit includes a constant voltage source and a voltage follower circuit in which the constant voltage source is connected to a positive input terminal and the conductive layer is connected to a negative input terminal, and
the signal detection unit includes a resistor connected between the output terminal of the voltage follower circuit and the conductive layer, and an amplifier that amplifies the potential difference between both ends of the resistor and outputs the amplified potential difference as the voltage signal.

8. The charged particle beam device according to claim 6, wherein
the bias power supply unit includes a constant voltage source and a voltage follower circuit in which the constant voltage source is connected to a positive input terminal and the output terminal is connected to a negative input terminal, and
the signal detection unit includes a resistor that is connected between the output terminal of the voltage follower circuit and the conductive layer, and an amplifier that amplifies the potential difference between both ends of the resistor and outputs the amplified potential difference as the voltage signal.

9. The charged particle beam device according to claim 6, wherein
the bias power supply unit includes a first terminal and a second terminal, and a constant voltage source in which the first terminal is connected to the conductive layer, and
the signal detection unit includes a transimpedance amplifier in which a negative input terminal is connected to the second terminal of the constant voltage source.

10. The charged particle beam device according to claim 6, wherein
the bias power supply unit includes a first terminal and a second terminal, and a constant voltage source in which the first terminal is connected to the conductive layer, and
the signal detection unit includes a resistor that is connected between the second terminal of the constant voltage source and the reference potential portion, and an amplifier that amplifies the potential difference between both ends of the resistor and outputs the amplified potential difference as the voltage signal.

11. The charged particle beam device according to claim 4, wherein
the sample chamber is arranged in a vacuum partition that holds the space around the sample at a vacuum degree lower than that of the sample chamber where the stage is arranged,
the vacuum partition includes a vacuum partition upper part which is a conductor, a vacuum partition lower part which is an insulator, and a sealing material which is arranged between the vacuum partition upper part and the vacuum partition lower part to make the inside of the vacuum partition airtight, and
the vacuum partition upper part is electrically connected to the conductive layer of the sample chamber, and the conductive layer of the sample chamber is irradiated with an electron beam through an opening of the vacuum partition upper part.

12. The charged particle beam device according to claim 5, wherein
the sample chamber is arranged in a vacuum partition that holds the space around the sample at a vacuum degree lower than that of the sample chamber where the stage is arranged,
the vacuum partition includes a vacuum partition upper part which is a conductor, a vacuum partition lower part which is an insulator, and a sealing material which is arranged between the vacuum partition upper part and the vacuum partition lower part to make the inside of the vacuum partition airtight, and
the reference potential portion is fixed to the vacuum partition lower part of the vacuum partition,
the vacuum partition upper part is electrically connected to the conductive layer of the sample chamber, and the conductive layer of the sample chamber is irradiated with an electron beam through an opening of the vacuum partition upper part.

13. A charged particle beam device comprising:
an electron optics system;
a stage;
a sample chamber holding a sample between a first insulating layer and a second insulating layer facing the first insulating layer, and including a conductive layer formed on the first insulating layer;
a first signal detection circuit connected to the conductive layer and detecting a current flowing through the conductive layer; and
a second signal detection circuit including a detection electrode providing a reference potential and arranged to face the sample across the second insulating layer, and detecting an electric signal generated in the detection electrode; and
a main control unit for controlling the electron optics system and the stage, wherein
the main control unit irradiates the conductive layer of the sample chamber placed on the stage with an electron beam from the electron optics system, and is input with a first detection signal from the first signal detection circuit and a second detection signal from the second signal detection circuit.

14. The charged particle beam device according to claim 13, wherein
the main control unit converts the first detection signal into first pixel gradation data according to the intensity thereof for each deflection position of the electron beam to the sample chamber and converts the second detection signal into second pixel gradation data according to the intensity thereof.

15. The charged particle beam device according to claim 13, wherein
the sample chamber includes a first outer frame portion that supports the first insulating layer and a second outer frame portion that supports the second insulating layer,
the first outer frame portion includes a first window portion recessed in an inverted pyramid shape in the scanning range of the electron beam to the sample chamber placed on the stage,
the conductive layer is formed on the first insulating layer in a first internal region which is the bottom surface of the first window portion, and is formed on the outer frame portion in other than the first internal region,
in a second internal region which is the bottom surface of a second window portion formed on the second outer frame portion in a region that is the same as the first internal region or covers the first internal region when viewed from the upper surface of the sample chamber, the second insulating layer is exposed to an atmosphere outside of the second insulating layer, and
the detection electrode is arranged in the second internal region.

16. The charged particle beam device according to claim 15, wherein
the sample chamber is arranged in a vacuum partition that holds the space around the sample at a vacuum degree lower than that of the sample chamber in which the stage is located,
the vacuum partition includes a vacuum partition upper part which is a conductor, a vacuum partition lower part which is an insulator, and a sealing material which is arranged between the vacuum partition upper part and the vacuum partition lower part and makes the inside of the vacuum partition airtight,
the detection electrode is fixed to the vacuum partition lower part of the vacuum partition, and
the vacuum partition upper part is electrically connected to the conductive layer of the sample chamber, and the conductive layer of the sample chamber is irradiated with an electron beam through an opening of the vacuum partition upper part.

17. A charged particle beam device comprising:
an electron optics system placed on a column;
a stage placed in a sample chamber with a vacuum degree lower than that of the column;
a vacuum membrane holder including a membrane including an insulating layer and a conductive layer;
a signal detection circuit connected to the conductive layer and detecting a current flowing through the conductive layer; and
a main control unit for controlling the electron optics system and the stage, wherein
the column and the sample chamber are connected via the vacuum membrane holder, and
in the main control unit, a sample placed on the stage is irradiated with an electron beam from the electron optics system through the membrane, and a detection signal from the signal detection circuit is input.

18. The charged particle beam device according to claim 17, wherein
the main control unit controls irradiation of the sample with an electron beam of the electron optics system at a plurality of deflection positions and converts a detection signal from the signal detection circuit into pixel gradation data according to the intensity thereof for each of the plurality of deflection positions of the electron beam.

19. The charged particle beam device according to claim 17, wherein
the vacuum membrane holder includes an outer frame portion that supports the insulating layer,
the outer frame portion includes a window portion recessed in an inverted pyramid shape in the scanning range of an electron beam, and
the conductive layer is formed on the insulating layer in an internal region which is the bottom surface of the window portion and is formed on the outer frame portion in other than the internal region.

20. The charged particle beam apparatus according to claim 17, wherein
the column has a first potential, and a second potential higher than the first potential is applied to the conductive layer of the vacuum membrane holder.

21. An autofocus processing method of a charged particle beam device including an electron optics system, a stage, a main control unit for controlling the electron optics system and the stage, and a computer performing image processing, the method comprising:
placing a sample chamber that includes a first insulating layer that is in contact with a sample, an outer frame portion that supports the first insulating layer and includes a window portion recessed in an inverted pyramid shape, and a conductive layer, on the stage, wherein the conductive layer is formed on the first insulating layer in an inner region which is the bottom surface of the window portion, and is formed on the outer frame portion in other than the inner region, connecting a signal detection circuit connected to the conductive layer and detecting a current flowing through the conductive layer, to the main control unit, in the main control unit, scanning an electron beam with respect to a region including the window portion by the electron optics system, and converting a detection signal from the signal detection circuit into first pixel gradation data of a low-magnification image according to the intensity thereof for each deflection position of the electron beam to the sample chamber, in the computer, performing image processing on the low-magnification image acquired from the first pixel gradation data, and acquiring the position coordinates of a rectangular area including one vertex of the internal region and an inclined surface of the window portion in contact with one vertex of the internal region, in the main control unit, moving the field of view so that the rectangular region becomes the center, scanning an electron beam at a predetermined observation magnification by the electron optics system, and converting a detection signal from the signal detection circuit into second pixel gradation data of a high-magnification image according to the intensity thereof for each deflection position of the electron beam to the sample chamber, and in the computer, performing image processing on the high-magnification image acquired from the second pixel gradation data, calculating a sharpness evaluation value, and determining the success or failure of autofocus processing based on the sharpness evaluation value.

22. The autofocus processing method according to claim 21, wherein if the sharpness evaluation value calculated by the computer exceeds a threshold value, the main control unit changes the focus condition and the astigmatism correction condition of the electron optics system to move the field of view so that the rectangular region becomes the center, scans an electron beam at a predetermined observation magnification by the electron optics system, and converts a detection signal from the signal detection circuit into second pixel gradation data according to the intensity thereof for each deflection position of the electron beam to the sample chamber.

23. A detector comprising:

a sample chamber including a holding space for holding a sample, and including a first insulating layer forming the holding space and a conductive layer formed on the first insulating layer;

a first signal detection circuit connected to the conductive layer and detecting a current flowing through the conductive layer when the conductive layer is irradiated with an electron beam.

24. The detector according to claim 23, wherein the sample chamber includes a first outer frame portion that supports the first insulating layer, and the first outer frame portion includes a first window portion recessed in an inverted pyramid shape, and the conductive layer is formed on the first insulating layer in a first internal region which is the bottom surface of the first window portion and is formed on the first outer frame portion in other than the first internal region.

25. The detector according to claim 24, wherein the sample chamber includes a second insulating layer provided facing the first insulating layer and forming the holding space, a substrate supporting the second insulating layer, and a reference potential portion provided in contact with the substrate and providing a reference potential.

26. The detector according to claim 24, wherein the sample chamber is provided with a second insulating layer provided facing the first insulating layer and forming the holding space, a second outer frame portion supporting the second insulating layer, and a reference potential portion providing a reference potential, and in a second internal region which is the bottom surface of a second window portion formed in the second outer frame portion in a region that is the same as the first internal region or covers the first internal region when viewed from the upper surface of the sample chamber, the second insulating layer is exposed to an atmosphere outside of the second insulating layer, and the reference potential portion is arranged in the second internal region.

27. The detector according to claim 24, wherein the sample chamber includes a second insulating layer provided facing the first insulating layer and forming the holding space, and a second outer frame portion supporting the second insulating layer, a second signal detection circuit, which includes a detection electrode that provides a reference potential and is arranged to face the sample across the second insulating layer, and detects an electric signal generated in the detection electrode, is included, in the second internal region, which is the bottom surface of a second window portion formed on the second outer frame portion in a region that is the same as the first internal region or covers the first internal region when viewed from the upper surface of the sample chamber, the second insulating layer is exposed to an atmosphere outside of the second insulating layer, and the detection electrode is arranged in the second internal region.

28. A detector comprising:

a vacuum membrane holder including a membrane including an insulating layer and a conductive layer; and a signal detection circuit connected to the conductive layer and detecting a current flowing through the conductive layer when the conductive layer is irradiated with an electron beam, wherein the vacuum membrane holder is arranged between a column where an electron optics system for emitting an electron beam is stored and a sample chamber having a vacuum degree lower than that of the column.

29. The detector according to claim 28, wherein the vacuum membrane holder includes an outer frame portion that supports the insulating layer, the outer frame portion includes a window portion recessed in an inverted pyramid shape in the scanning range of the electron beam, and the conductive layer is formed on the insulating layer in an internal region which is the bottom surface of the window portion and is formed on the outer frame portion in other than the internal region.

* * * * *